United States Patent [19]
Abiko et al.

[11] Patent Number: 6,051,472
[45] Date of Patent: Apr. 18, 2000

[54] SEMICONDUCTOR DEVICE AND METHOD OF PRODUCING THE SAME

[75] Inventors: Hitoshi Abiko; Isami Sakai, both of Tokyo, Japan

[73] Assignee: NEC Corporation, Tokyo, Japan

[21] Appl. No.: 08/937,800

[22] Filed: Sep. 25, 1997

[30] Foreign Application Priority Data

Sep. 26, 1996 [JP] Japan ................................. 8-254438

[51] Int. Cl.$^7$ ................................................ H01L 21/336
[52] U.S. Cl. ........................ 438/296; 438/424; 438/294; 438/688; 148/DIG. 50
[58] Field of Search ..................... 438/294, 296, 438/424, 652, 655, 656, 688; 148/DIG. 50

[56] References Cited

U.S. PATENT DOCUMENTS

| | | |
|---|---|---|
| 4,862,232 | 8/1989 | Lee . |
| 4,963,502 | 10/1990 | Teng et al. . |
| 5,132,755 | 7/1992 | Ueno . |
| 5,275,965 | 1/1994 | Manning ................................. 438/430 |
| 5,604,159 | 2/1997 | Cooper et al. ........................... 438/430 |
| 5,652,176 | 7/1997 | Maniar et al. ........................... 438/437 |

FOREIGN PATENT DOCUMENTS 10-27842  1/1998  Japan .

OTHER PUBLICATIONS

C. G. Jambotkar, "FET Structure", IBM Technical Disclosure Bulletin, vol. 24. No. 1A, Jun. 1981.

*Primary Examiner*—Trung Dang
*Attorney, Agent, or Firm*—Sughrue, Mion, Zinn, Macpeak & Seas, PLLC

[57] ABSTRACT

A semiconductor device of the present invention and using trench isolation includes contact holes. Spacers are formed on the shoulder portions of a device region exposed in the contact holes. To form the spacers, a silicon oxide film is formed and then etched by anisotropic etching such that the film does not fill up the contact holes. The anisotropic etching may be effected after oxidation. With this structure, it is possible to prevent junction leakage current from increasing.

3 Claims, 10 Drawing Sheets

SEMICONDUCTOR DEVICE AND METHOD OF PRODUCING THE SAME

BACKGROUND OF THE INVENTION

The present invention relates to a semiconductor device promoting dense and highly integrated packaging and a method of producing the same and, more particularly, to the structure of contact portions of a MOSFET (Metal Oxide Semiconductor Field Effect Transistor) with trench isolation and a method of producing the same.

A semiconductor device with an isolation region formed by trenches is conventional. The trenches are formed in the surface of a semiconductor substrate and then filled with silicon oxide. After a gate electrode and diffusion layers have been formed, the entire surface of the resulting laminate is covered with an interlayer insulation film. Contact holes are formed in the insulation film. A metal film is formed in the contact holes and then patterned to form wirings. The problem with this semiconductor device is that a junction leak current characteristic deteriorates due to the progress of microstructure which is derived from the high integration of semiconductor devices. Specifically, because the dimensions of the semiconductor device, as seen in a plan view, are reduced due to the progress of microconfiguration, a margin for the positional deviation between the contact holes and the diffusion layers is reduced. As a result, the contact holes are apt to partly extend to the outside of the diffusion layers. It follows that a metal film for wiring filled in the contact holes short-circuits the substrate and diffusion layers, aggravating the junction leak current problem.

Japanese Patent Laid-Open Publication No. 62-190847 proposes a solution to the above problem. Specifically, in this document, a silicon nitride film intervenes between a silicon oxide film filling an isolation region and a substrate. This kind of scheme, however, brings about another problem that a difference between the coefficient of thermal expansion of the substrate and that of the silicon nitride film is noticeable and introduces defects in the substrate during heating due to a thermal stress. The defects also aggravates the junction leak.

SUMMARY OF THE INVENTION

It is therefore an object of the present invention to provide a semiconductor device with an extended contact hole structure and capable of obviating an increase in junction leakage current ascribable to a microstructure, and a method of producing the same.

A semiconductor device of the present invention has a silicon substrate, a device region delimited by an isolation region formed by forming trenches in the silicon substrate and then filling the trenches with an insulating material, diffusion layers formed on the surface portions of the silicon substrate including portions surrounding the device region, an interlayer insulating film formed on the silicon substrate formed with the isolation region and diffusion layers, contact holes extending throughout the interlayer insulation film to the diffusion layers such that the side walls of the device region are partly exposed, spacers covering the exposed portions of the side walls of the device region, and wirings contacting the diffusion layers in the contact holes.

A method of producing a semiconductor device of the present invention includes a step of forming trenches in the surface of a silicon substrate and then filling the trenches with an insulating material to thereby form an isolation region. Diffusion layers are selectively formed on the surface of the device region such that the diffusion layers contact the isolation region. An interlayer insulating film is formed on the entire surface of the silicon substrate, and contact holes are formed which extend through out the interlayer insulation film to the diffusion layers such that the side walls of the device region are partly exposed. Spacers are formed which cover the exposed portions of the side walls of the device region and is formed of silicon oxide. Wirings are formed which contact the diffusion layers in the contact holes provided with the spacers.

BRIEF DESCRIPTION OF THE DRAWINGS

The above and other objects, features and advantages of the present invention will become apparent from the following detailed description taken with the accompanying drawings in which.

DESCRIPTION OF THE PREFERRED EMBODIMENTS

Figure 2:
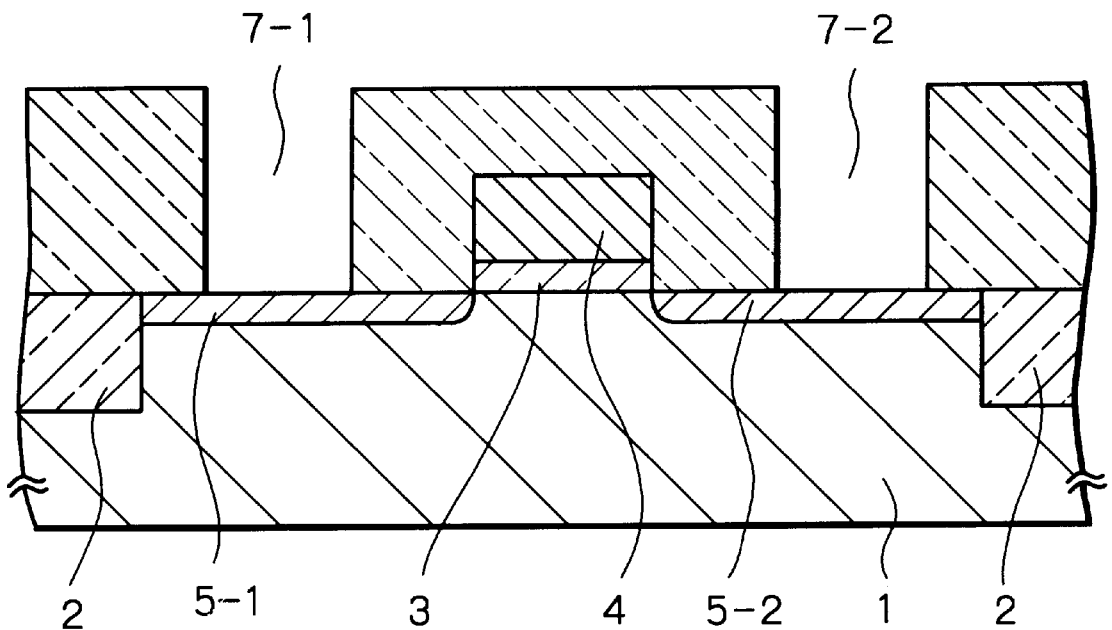
Figure 3:
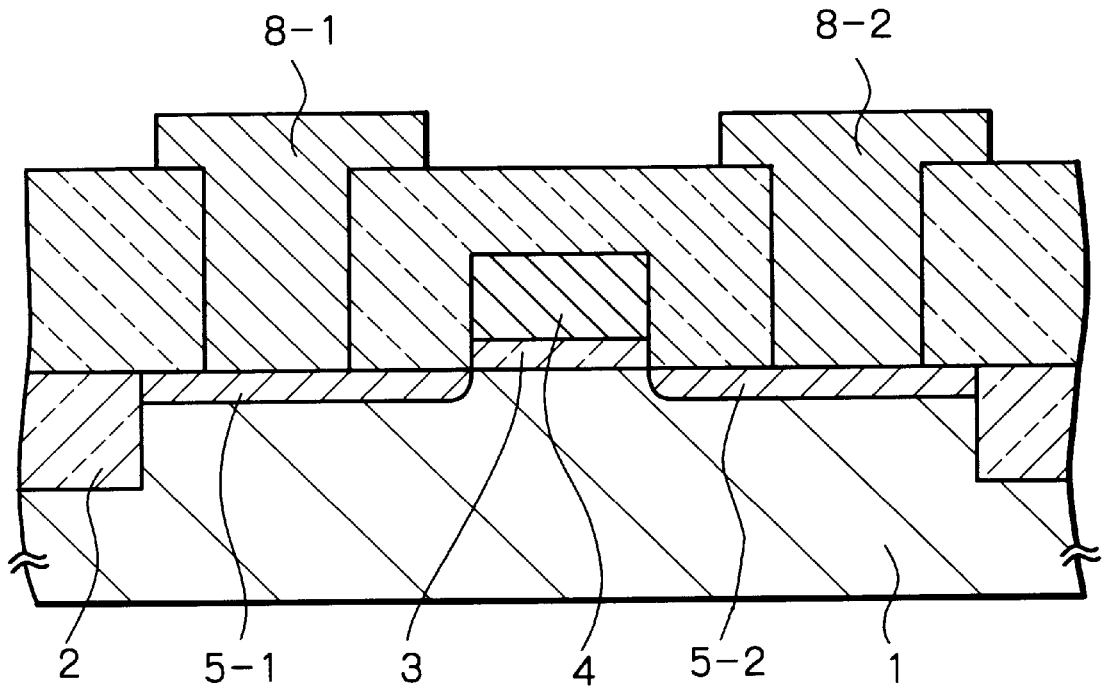

To better understand the present invention, brief reference will be made to a conventional semiconductor device with trench isolation, shown in FIG. 1. As shown, the semiconductor device includes a P type silicone substrate 1 formed with trenches in the surface thereof. Silicon oxide 2 is filled in the trenches of the substrate 1, forming an isolation region. A gate electrode 4 is formed on the substrate 1 with the intermediary of a gate insulation film 3. N⁺type diffusion layers 5-1 and 5-2 (source and drain) are also formed on the substrate 1. By these steps, a MOSFET is produced. Then, the surface of the laminate is covered with an interlayer insulation film 6. Subsequently, as shown in FIG. 2, contact holes 701 and 7-2 are formed in the insulation layer 6. As shown in FIG. 3, a metal film for wiring is formed and then patterned to form wirings 8-1 and 8-2.

Figure 1:
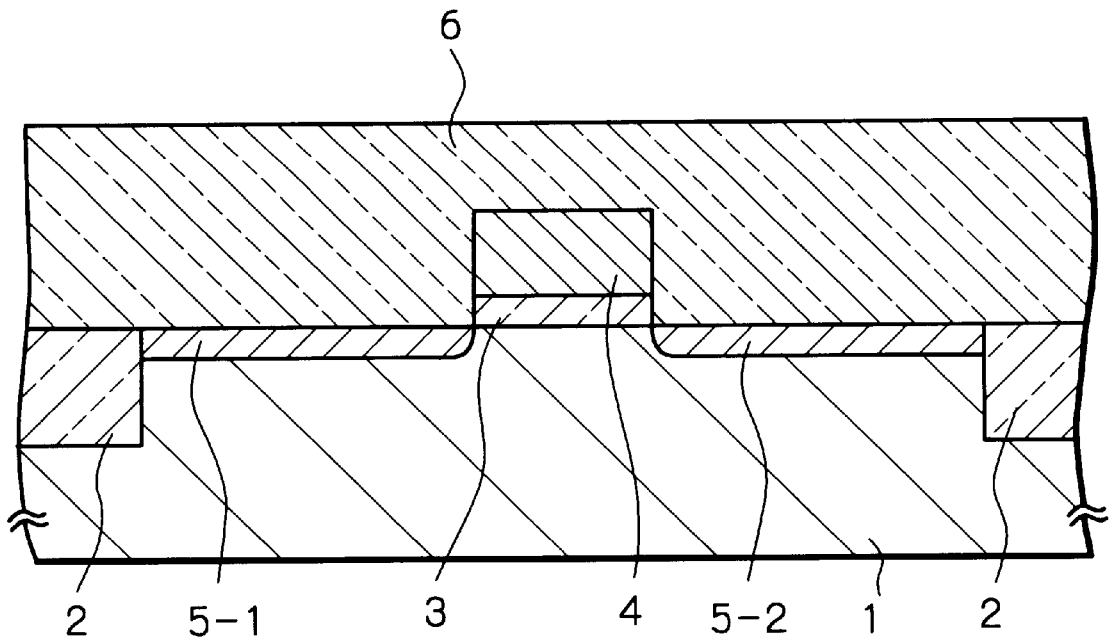
FIGS. 1–3 are sections showing a sequence of steps for producing a conventional semiconductor device.

However, the problem with the semiconductor device shown in FIG. 1 is that a junction leak current characteristic deteriorates due to the progress of microstructure which is derived from the high integration of semiconductor devices, as stated earlier. Specifically, because the dimensions of the semiconductor device, as seen in a plan view, are reduced due to the progress of microstructure, a margin for the positional deviation between the contact holes 7-1 and 7-2 and the diffusion layers 5-1 and 5-2 in which they are formed is reduced. Therefore, the contact holes 7-1 and 7-2 are apt to partly extend to the outside of the diffusion layers 5-1 and 5-2.

Figure 4:
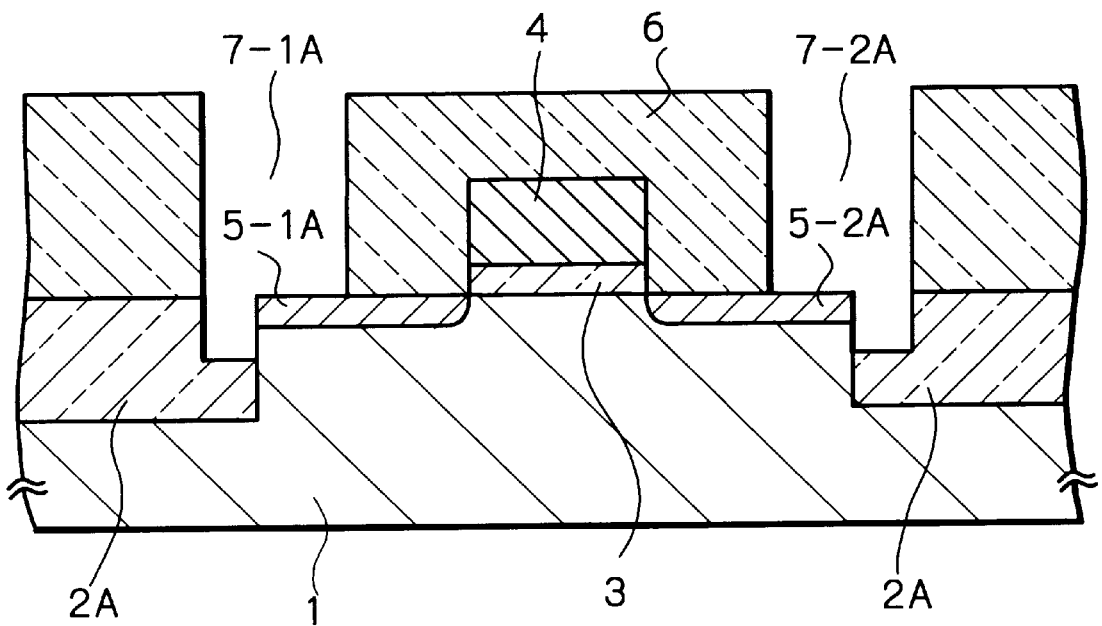
FIGS. 4 and 5 are sections for describing the problem of the conventional semiconductor device.
Figure 5:
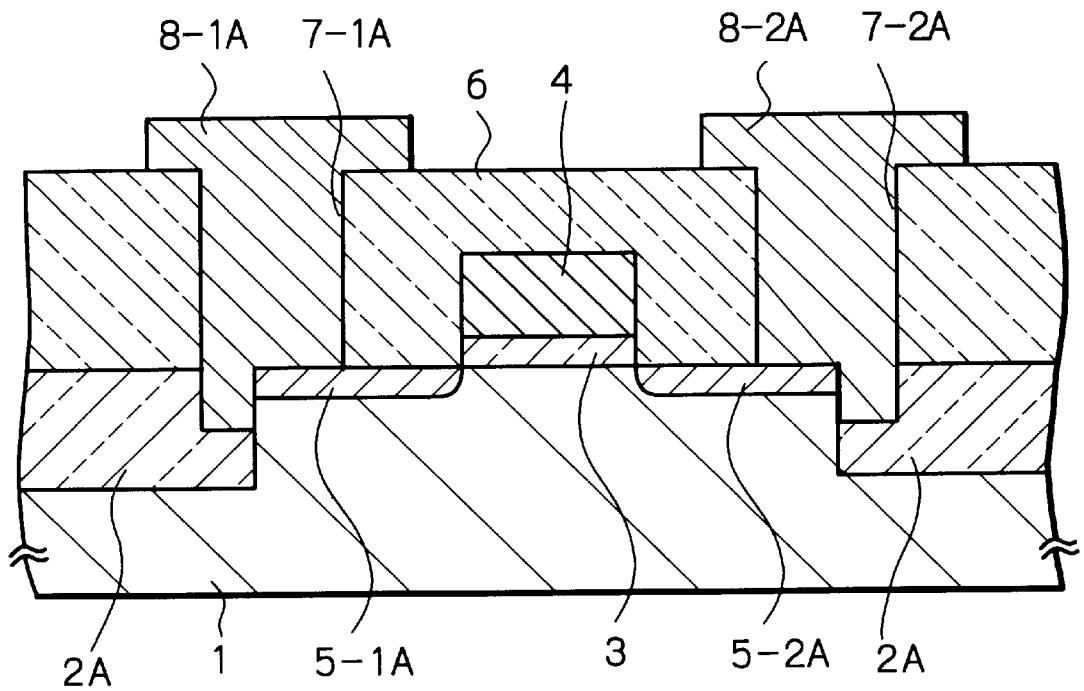

Apart from the accidental positional deviation, the dimensions of the diffusion layers 5-1 and 5-2 may be intentionally reduced such that the contact holes 7-1 and 7-2 partly extend to the outside of the diffusion layers 5-1 and 5-2. FIG. 4 shows this kind of structure, i.e., extended contact hole structure mentioned earlier. As shown, when contact holes 7-1A and 7-2A are formed by anisotropic etching, the bottoms of the holes 7-1A and 7-2A are positioned below the surfaces of diffusion layers 5-1A and 5-2A (source and drain) outside of the diffusion layers 5-1A and 5-2A for the following reason. Generally, the thickness of the interlayer insulation film 6 and the etching rate during fabrication are not constant. In light of this, the laminate shown in FIG. 4 is etched deeply enough to expose the surfaces of the diffusion layers 5-1A and 5-2A at worst. As shown in FIG. 5, when the contact holes 7-1A and 7-2A are filled with a metal film for wiring, wirings 8-1A and 8-2A contact the portions of the substrate 1 adjoining the diffusion layers 5-1A and 5-2A and deeper than the interface between the substrate 1 and the layers 5-1A and 5-2A, resulting in short-circuiting. This aggravates the junction leak current problem. Although such an occurrence is not critical if the junction depth of the diffusion layers 5-1A and 5-2A is sufficiently great, a n increase in junction depth obstructs the microconfiguration of the semiconductor device.

Figure 6:
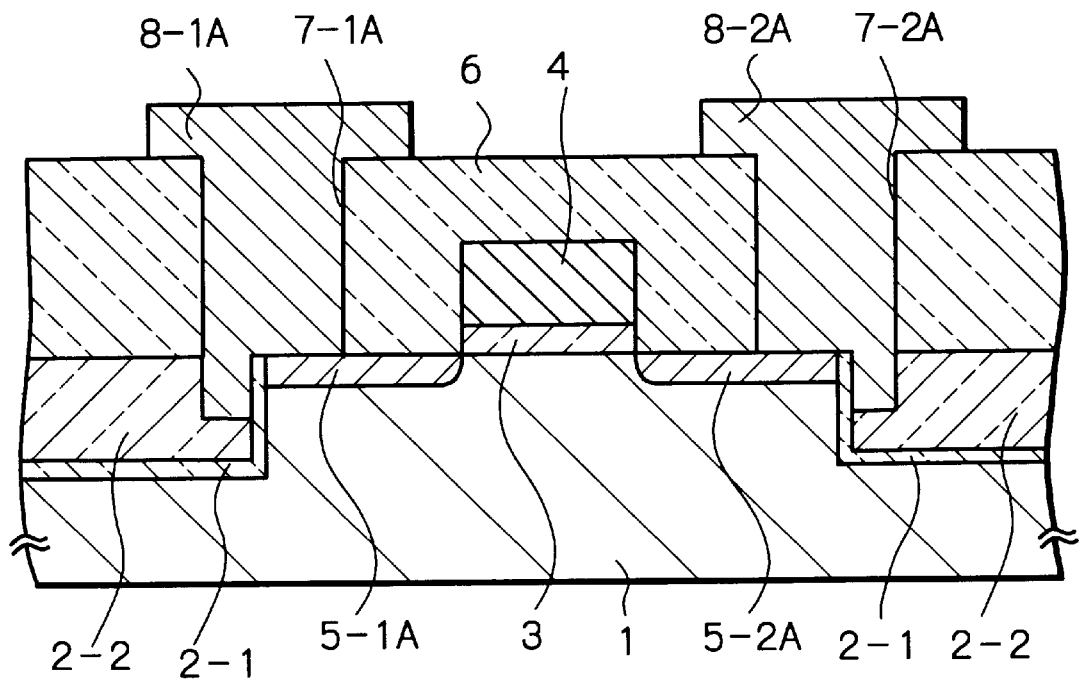
FIG. 6 is a section showing another conventional semiconductor device.

FIG. 6 shows a semiconductor device proposed in previously mentioned Japanese Patent Laid-Open Publication No. 62-190847 in order to solve the above problem. As shown, a silicon nitride film 2-1 intervenes between a silicon oxide film 2-2 filling an isolation region and the substrate 1. This kind of scheme, however, brings about another problem that a difference between the coefficient of thermal expansion of the substrate 1 and that of the silicon nitride film 2-1 is noticeable and introduces defects in the substrate 1 during heating due to a thermal stress. The defects also aggravate the junction leak current.

Preferred embodiments of the semiconductor device in accordance with the present invention will be described hereinafter. In the illustrative embodiments, structural elements identical with the elements shown in FIGS. 1–6 are designated by identical references.

Figure 7:
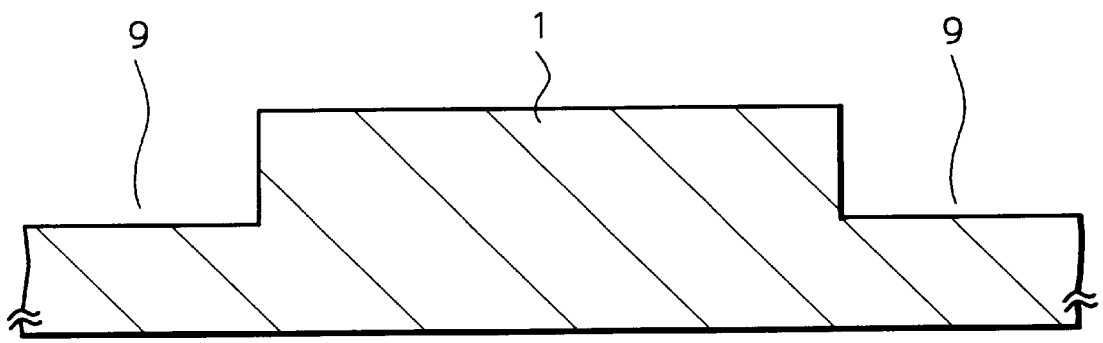
FIGS. 7–17 are sections showing a sequence of steps for producing a semiconductor device embodying the present invention.
Figure 8:
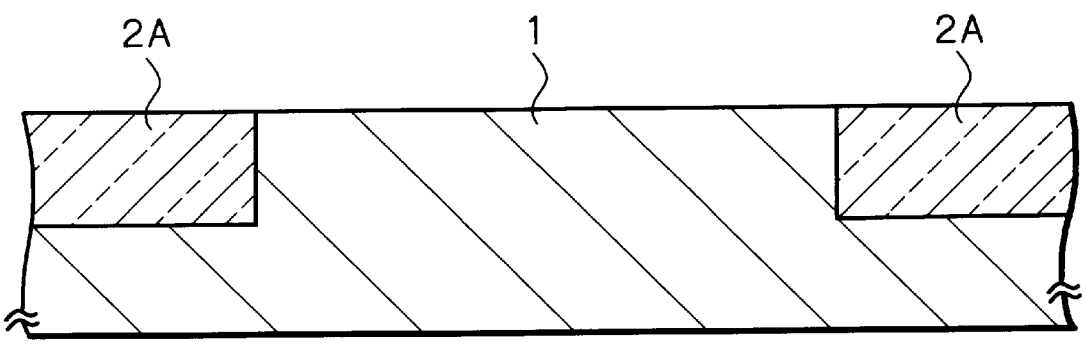
Figure 9:
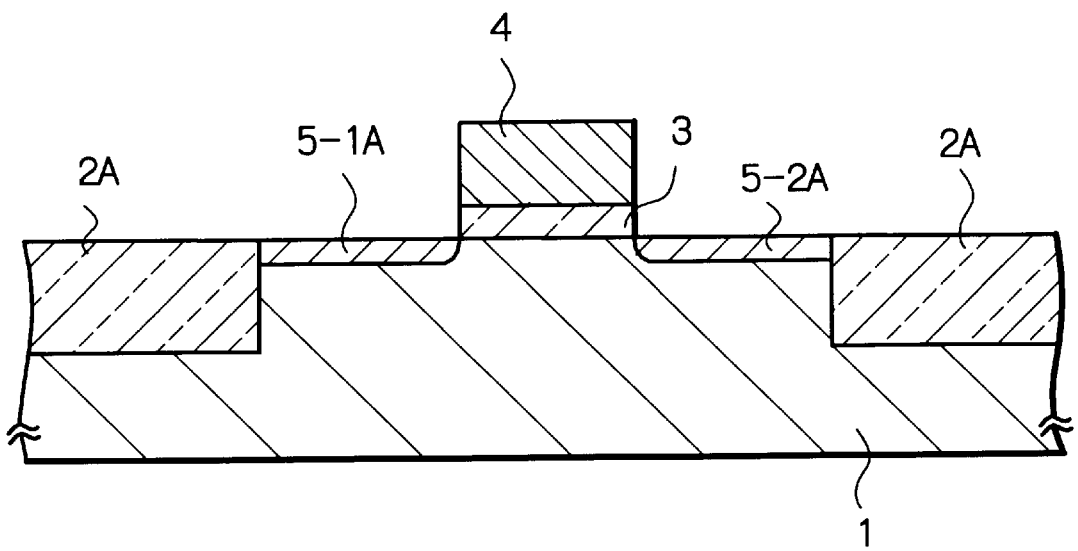
Figure 10:
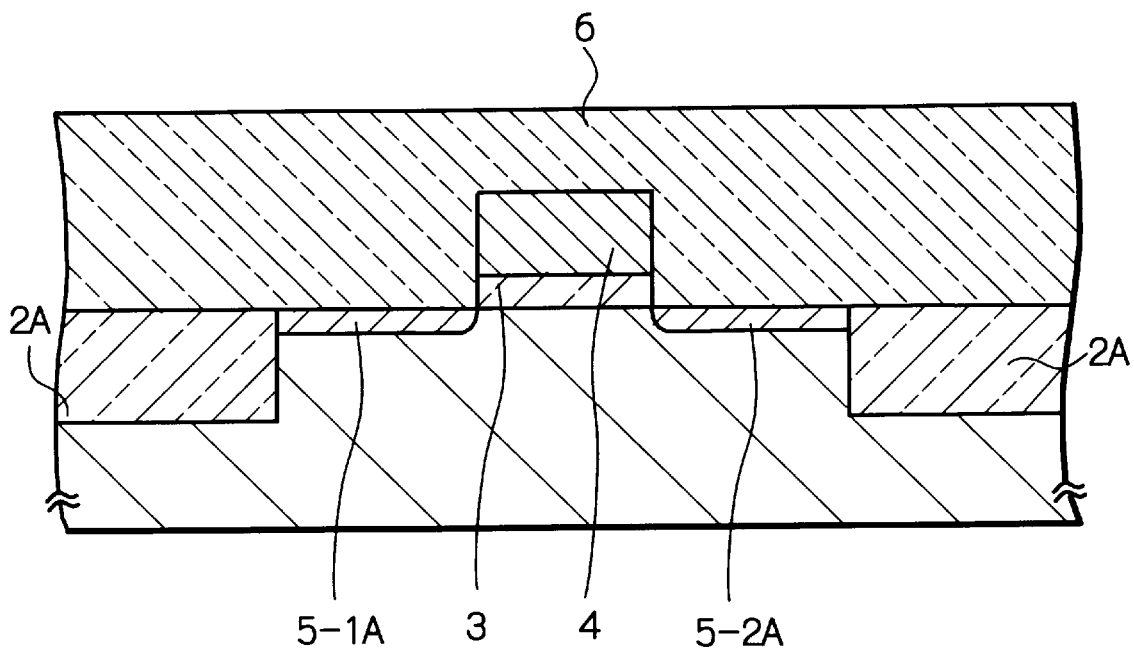
Figure 11:
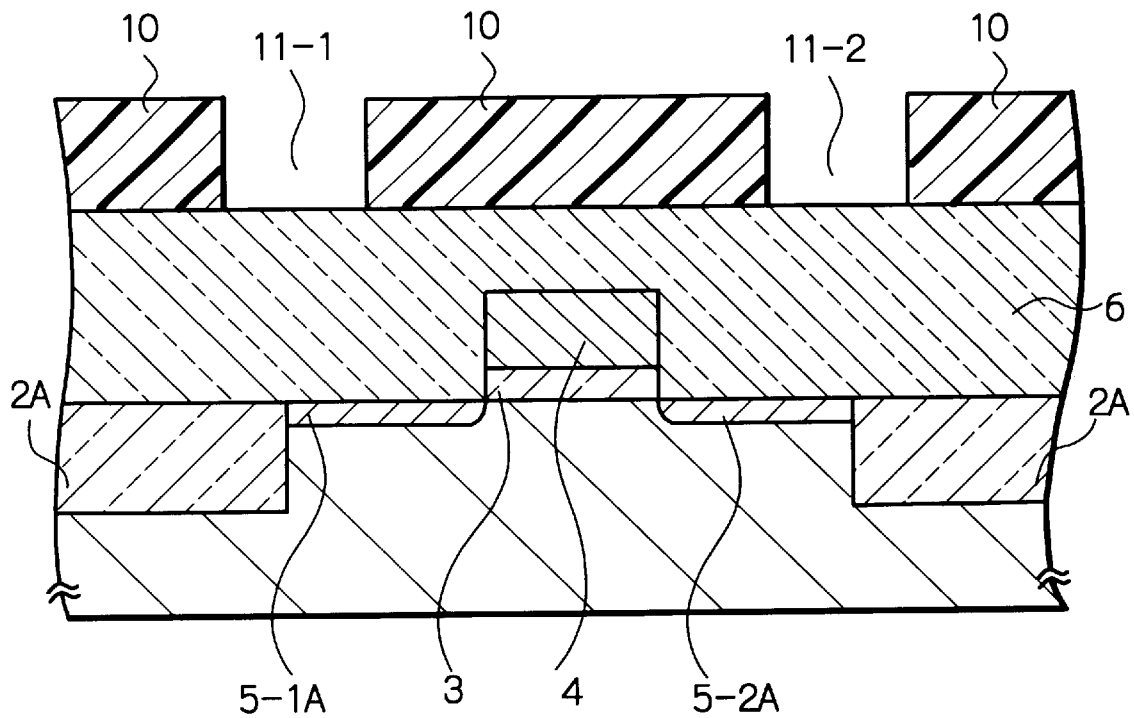
Figure 12:
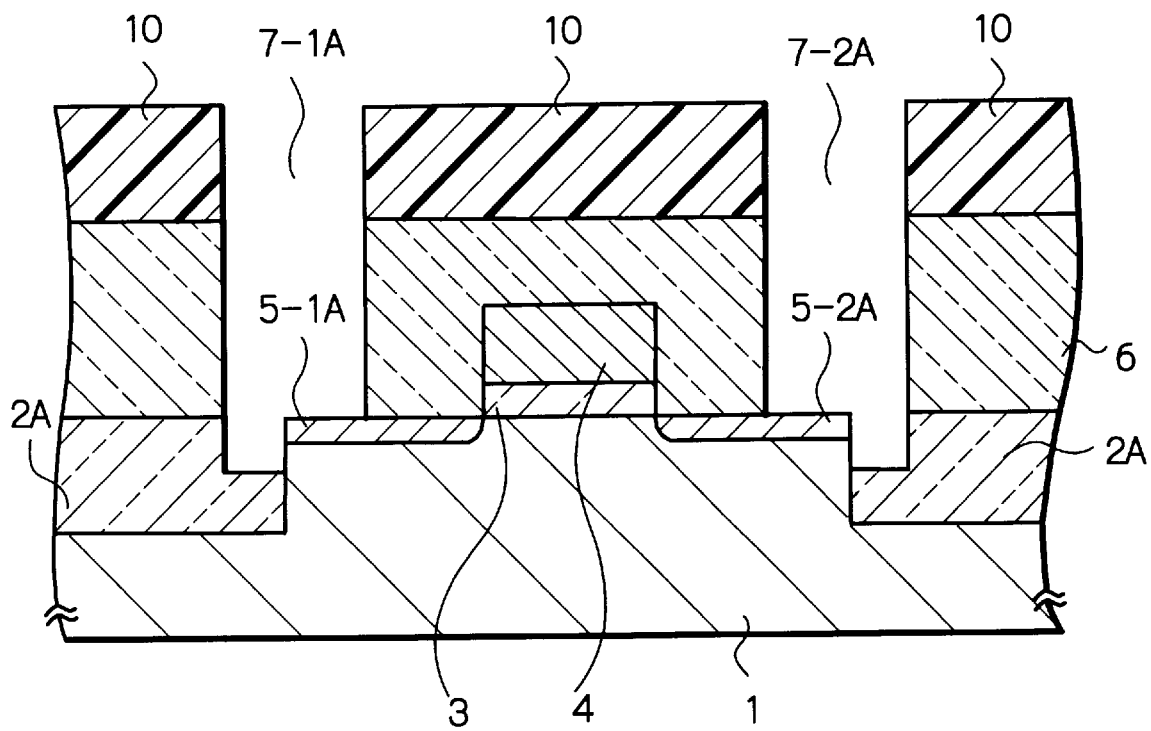

Referring to FIGS. 7–17, a semiconductor device embodying the present invention and a method of producing the same are shown. First, as shown in FIG. 7, trenches 9 are formed in the surface of a P type silicon substrate 1, forming a device region having, e.g., a rectangular shape as seen in a plan view. As shown in FIG. 8, the trenches 9 are filled with, e.g., silicon oxide 2A. As shown in FIG. 9, after a gate insulation fim 3 has been formed, a gate electrode 4 and N+ type diffusion layers 5-1A and 5-2A (source and drain) are formed. Subsequently, as shown in FIG. 11, contact holes 11-1 and 11-2 are formed in a resist film 10 by photolithography. As shown in FIG. 12, contact holes 7-1A and 7-2A are formed in an interlayer insulation film 6 by anisotropic etching with the above photoresist film 10 serving as a mask. The anisotropic etching is implemented as plasma etching using, e.g., $CF_4$ gas with which a sufficient selection ratio is available with respect to silicon. In the step shown in FIG. 12, the anisotropic etching is continued even after the surfaces of the diffusion layers 5-1 and 5-2 have been exposed for the purpose stated earlier in relation to the structure of FIG. 4.

Figure 13:
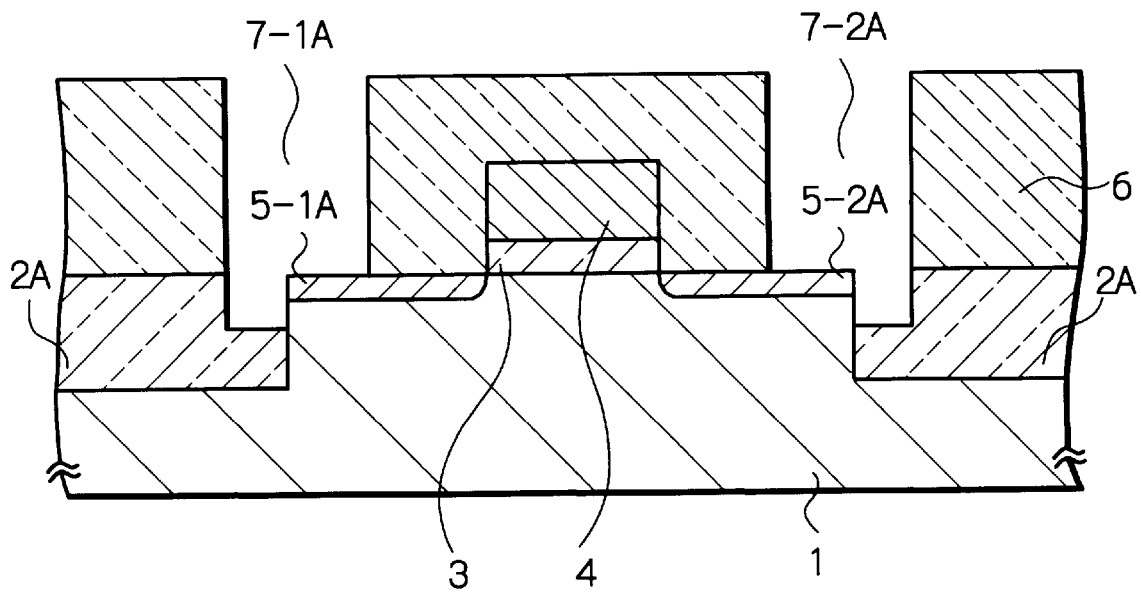
Figure 14:
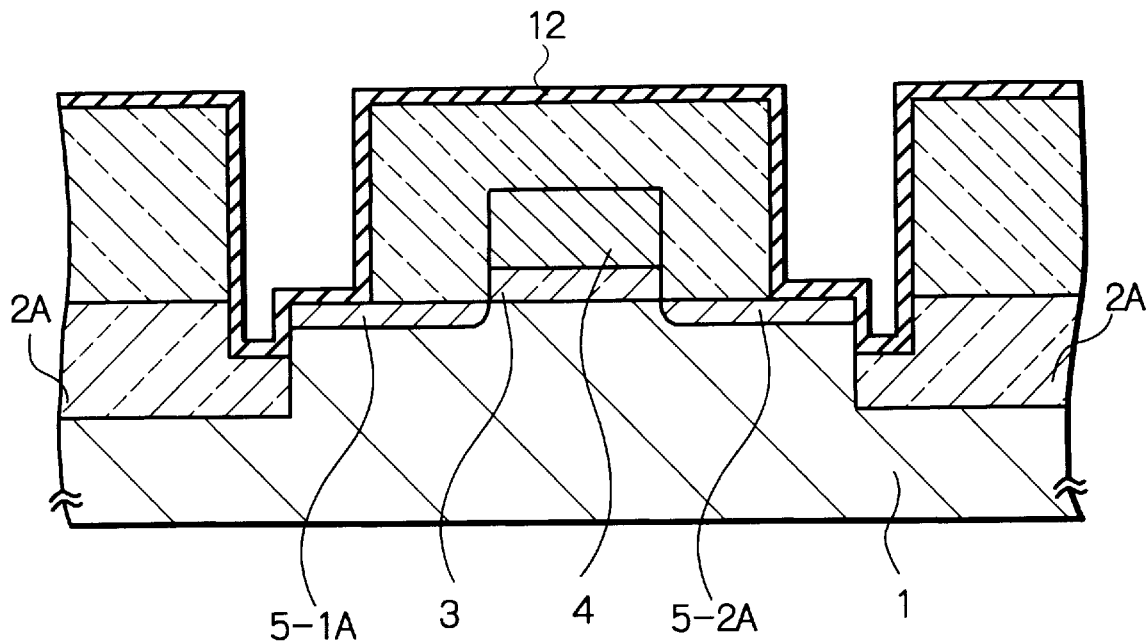
Figure 15:
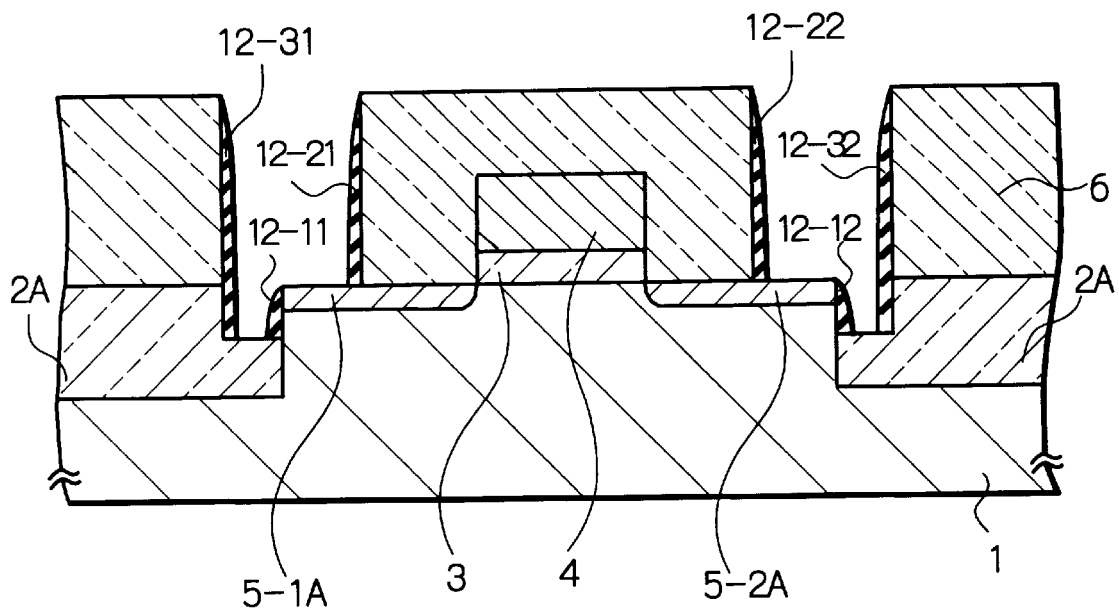
Figure 16:
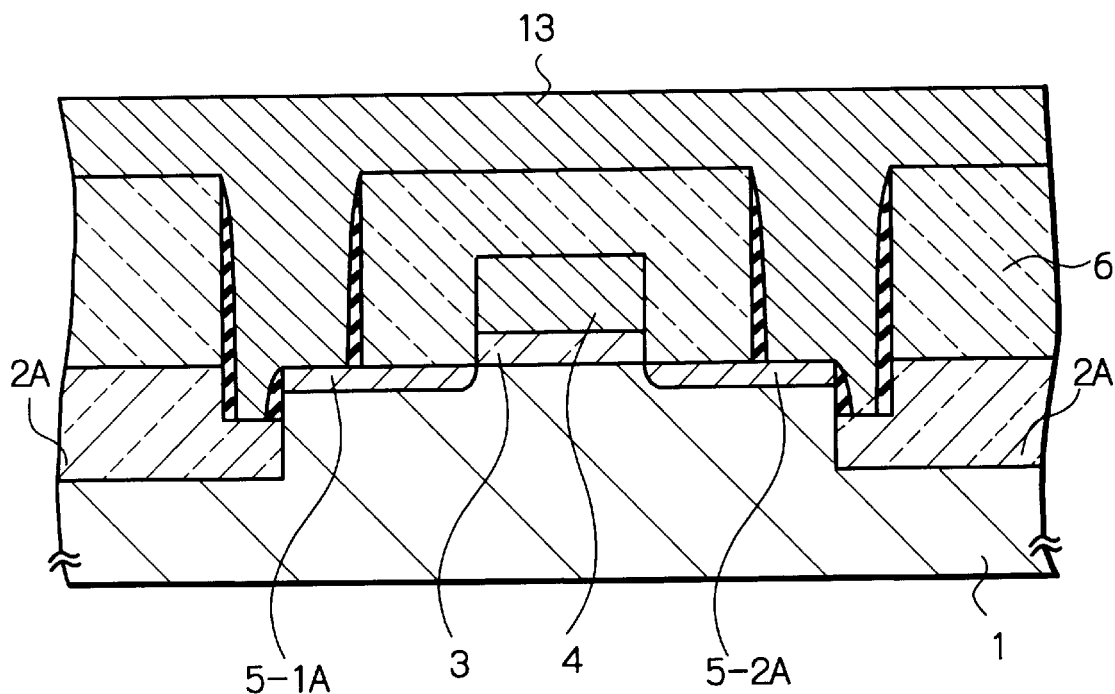
Figure 17:
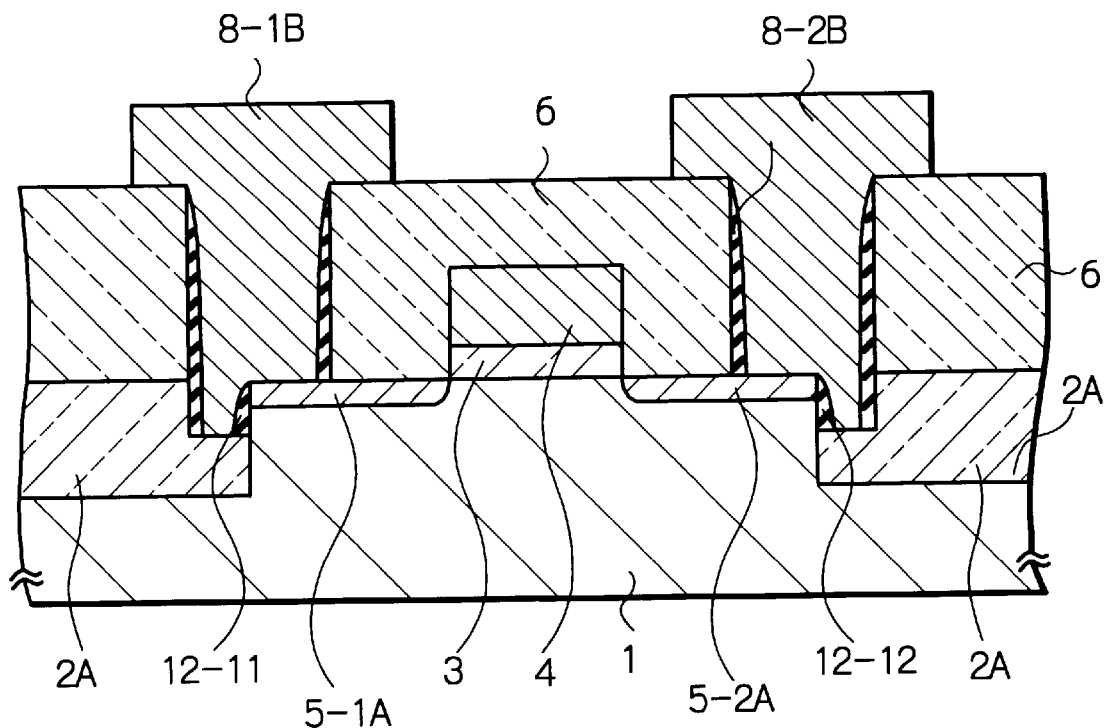

Subsequently, as shown in FIG. 13, the photoresist film 10 is removed. As shown in FIG. 14, a 20 nm thick silicon oxide film 12 is formed on the entire surface of the laminate of FIG. 13 by reduced pressure CVD (Chemical Vapor Deposition) or similar method featuring a desirable step covering capability. Then, the silicon oxide film 12 is etched by anisotropic etching, i.e., plasma etching using $CF_4$ gas. As a result, as shown in FIG. 15, spacers 12-21 and 12-22, spacers 12-31 and 12-32 and spacers 12-11 and 12-12 are formed on the side walls of the contact holes 7-1A and 7-1B and the side walls of the device region appearing in the holes 7-1A and 7-2A. Finally, as shown in FIG. 16, a film 13 of, e.g., Al—Si—Cu (aluminum-silicon-cuprum) alloy is formed while filling the contact holes 7-1A and 7-2A, and then patterned. Consequently, as shown in FIG. 17, wirings 8-1B and 8-2B are formed.

As stated above, in the illustrative embodiment, trenches are formed in the surface of the P type silicon substrate 1 and then filled with the silicon oxide 2A, forming a device region. The N+ type diffusion layers 5-1A and 5-2A cover the surface portions of the substrate I including the portions surrounding the device region. The interlayer insulation film 6 is formed on the substrate I formed with the isolation region 2A and diffusion layers 5-1A and 5-2A. The contact holes 7-1A and 7-2A extend throughout the insulation film 6 to the diffusion layers 5-1A and 5-2A while being partly exposed on the side walls of the device region. The spacers 12-11 and 12-12 formed of silicon oxide cover the side walls of the device region appearing in the contact holes 7-1A and 7-2A. In this configuration, despite that the bottoms of the contact holes 7-1A and 7-2A are positioned below the junction surfaces of the diffusion layers 5-1A and 5-2A in the isolation regions 2A, the spacers 12-11 and 12-12 isolate the wirings 8-1B and 8-2B from the portions of the substrate 1 where the diffusion layers 5-1A and 5-2A are absent. In addition, a difference between the coefficient of thermal expansion of silicon oxide and that of silicon is smaller than a difference in the coefficient of thermal expansion between silicon nitride and silicon. This allows a minimum of defects ascribable to a thermal stress to be introduced into the semiconductor device, and thereby reduces the junction leak current.

Figure 18:
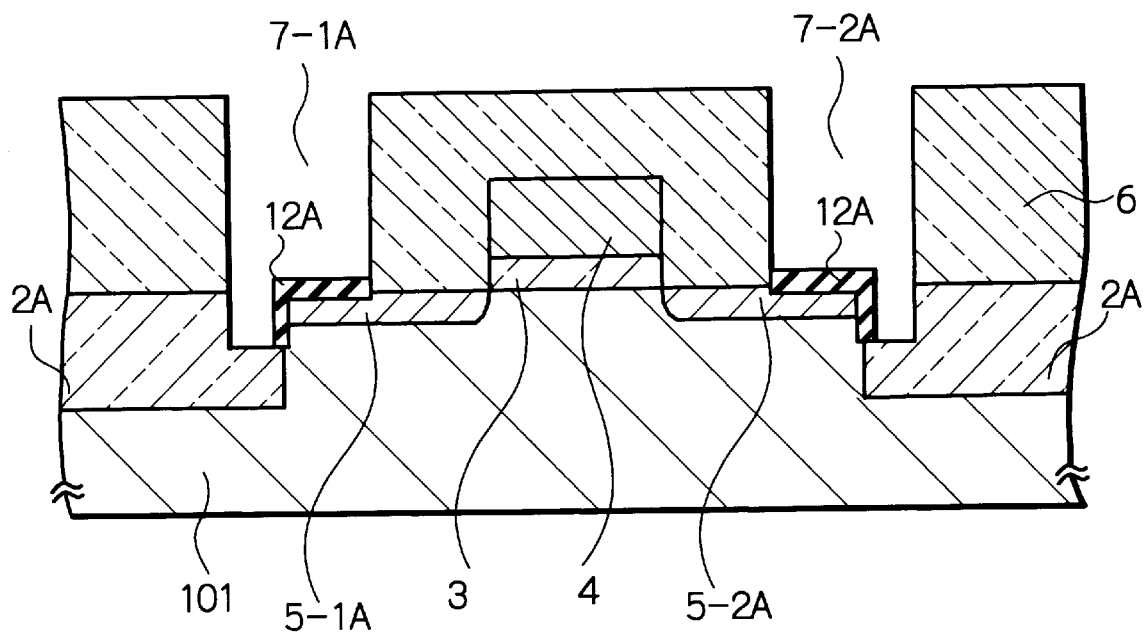
FIGS. 18–20 are sections showing a sequence of steps representative of an alternative embodiment of the present invention.
Figure 19:
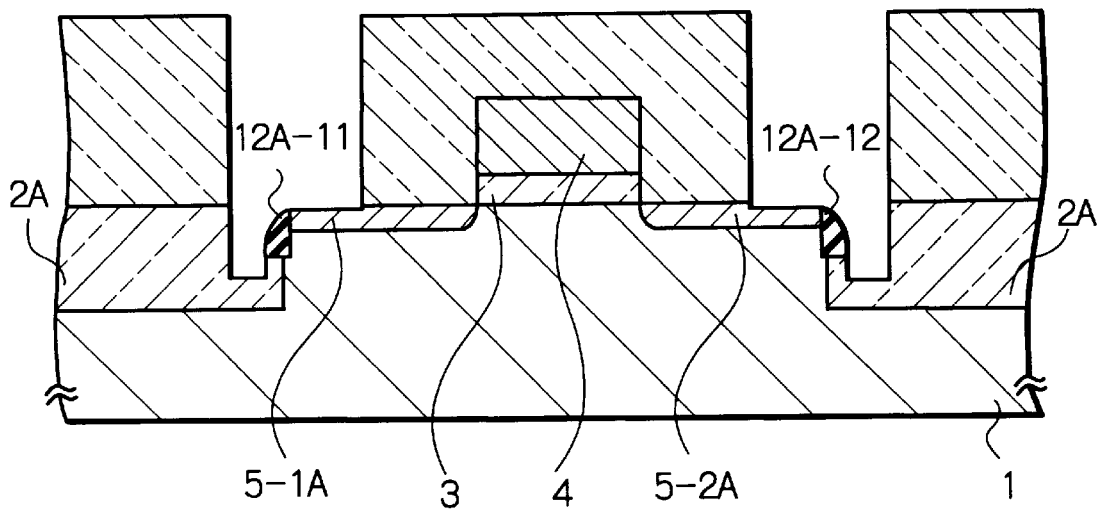
Figure 20:
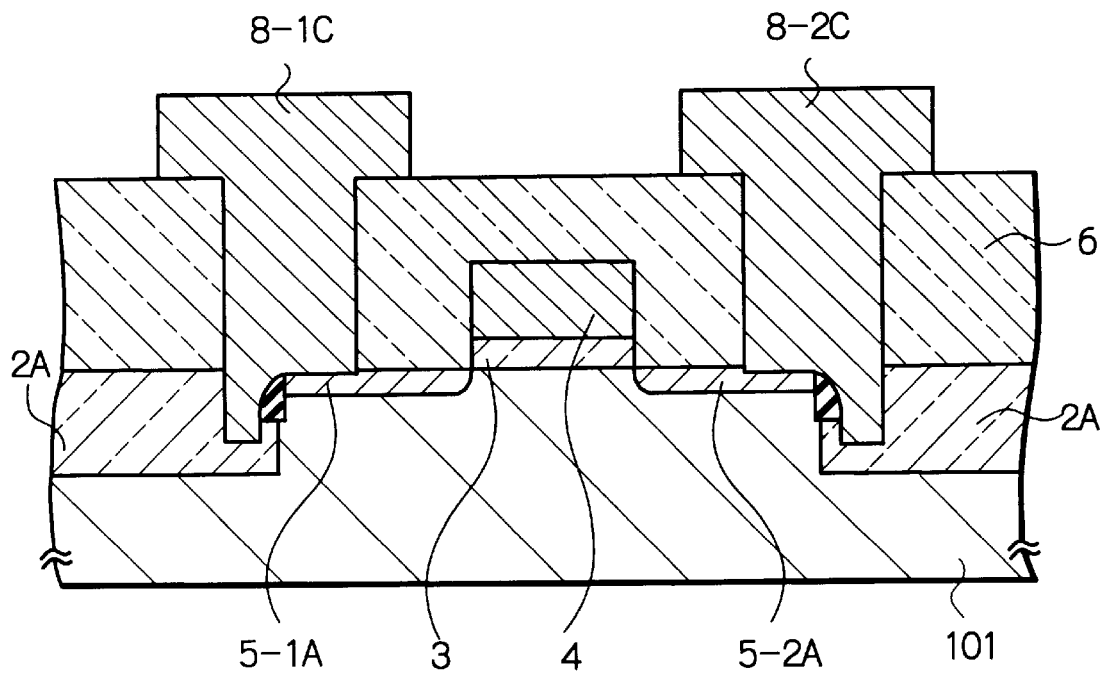

FIGS. 18–20 show an alternative embodiment of the present invention. As shown, the contact holes 7-1A and 7-2A are formed in the same manner as in the previous embodiment. Then, as shown in FIG. 18, a 20 nm thick silicon oxide film 12A is formed by low temperature oxidation in, e.g., oxidizing gas plasma. Subsequently, as shown in FIG. 19, spacers 12A-11 and 12A-12 are formed by anisotropic etching as in the previous embodiment. Finally, wirings 8-1C and 8-2C are formed, as shown in FIG. 20.

In the previous embodiment, the insulating ability of the spacers 12-11 and 12-12 is apt to decrease if the silicon oxide film 2A does not have a sufficient step covering ability. In the embodiment shown in FIGS. 18-20, plasma oxidation insures a uniform silicon oxide film 12A and thereby obviates junction leakage current more positively.

Experiments showed that the illustrative embodiments each reduces junction leakage current by two figures, compared to the conventional semiconductor device shown in FIG. 6.

While the embodiments have concentrated on the extended contact hole structure, the present invention is, of course, applicable to a structure in which contact holes are accidentally extend to isolation regions due to misalignment.

In summary, in accordance with the present invention, a semiconductor device includes spacers implemented by silicon oxide films and formed on the side walls of a device region appearing in contact holes. The spacers prevent wirings from directly contacting the portions of a silicon substrate adjoining diffusion layers. This, coupled with the fact that a difference in the coefficient of thermal expansion between silicon oxide and silicon is small enough to obviate defects ascribable to a thermal stress, prevents junction leakage current from increasing even in the extended contact hole structure. Stated another way, the area of diffusion layers and therefore junction capacitance is reduced. This contributes a great deal to the microstructure and high speed operation of the semiconductor device.

Various modifications will become possible for those skilled in the art after receiving the teachings of the present disclosure without departing from the scope thereof.

What is claimed is:

1. A method of producing a semiconductor device, comprising the steps of:
   (a) forming trenches in a surface of a silicon substrate and then filling said trenches with an insulating material to thereby form an isolation region;
   (b) selectively forming diffusion layers on a surface of said device region such that said diffusion layers contact said isolation region;
   (c) forming an interlayer insulating film on an entire surface of said silicon substrate, and forming contact holes extending through out said interlayer insulation film to said diffusion layers such that side walls of said device region are partly exposed;
   (d) forming spacers covering exposed portions of said side walls of said device region and formed of silicon oxide; and
   (e) forming wirings contacting said diffusion layers in said contact holes provided with said spacers.

2. A method as claimed in claim 1, wherein step (d) comprises (f) forming a silicon oxide film having a thickness not filling up said contact holes, and then etching said silicon oxide film by anisotropic etching until surfaces of said diffusion layers appear in said contact holes.

3. A method as claimed in claim 1, wherein step (d) comprises (g) forming a silicon oxide film on surfaces of said diffusion layers in said contact holes and said side walls of said device region by thermal oxidation, and then etching said silicon oxide film by anisotropic etching until said surfaces of said diffusion layers appear in said contact holes.

* * * * *